US006316332B1

(12) United States Patent
Lo et al.

(10) Patent No.: US 6,316,332 B1
(45) Date of Patent: Nov. 13, 2001

(54) METHOD FOR JOINING WAFERS AT A LOW TEMPERATURE AND LOW STRESS

(76) Inventors: Yu-Hwa Lo, 146 Lexington Dr.; Jizhi Zhang, 316 Highland Rd. #302, both of Ithaca, NY (US) 14850

(*) Notice: Subject to any disclaimer, the term of this patent is extended or adjusted under 35 U.S.C. 154(b) by 0 days.

(21) Appl. No.: 09/201,170

(22) Filed: Nov. 30, 1998

(51) Int. Cl.[7] .................................................. H01L 21/30
(52) U.S. Cl. .......................................... 438/455; 438/458
(58) Field of Search ................................... 438/455, 456, 438/457, 458, 459

(56) References Cited

U.S. PATENT DOCUMENTS

| | | | |
|---|---|---|---|
| 5,207,864 | 5/1993 | Bhat et al. ............................. | 156/633 |
| 5,407,856 | 4/1995 | Quenzer et al. . | |
| 5,421,953 | 6/1995 | Nagakubo et al. . | |
| 5,503,704 | * 4/1996 | Bower et al. ......................... | 156/291 |
| 5,785,874 | * 7/1998 | Eda ........................................ | 216/24 |
| 5,925,973 | * 7/1999 | Eda et al. ............................. | 310/348 |

FOREIGN PATENT DOCUMENTS

| | | |
|---|---|---|
| 0 651 449 | 5/1995 | (EP) . |
| 0 803 916 A2 | 10/1997 | (EP) . |
| 0 803 916 A3 | 3/2000 | (EP) . |
| 8-248213 | 9/1996 | (JP) . |

OTHER PUBLICATIONS

Liau, Z.L. et al, 1990, Wafer fusion: A Novel Technique for Optoelectronic Device Fabrication and Monolithic Integration, Appl. Phys. Lett 56 (8), pp. 737–739, Feb. 1990.
Kopperschmidt, P. et al, 1997, High Bond Energy And Themomechanical Stress In Silicon On Sapphire Wafer Bonding, Appl. Phys. Lett. 70 (22), pp 2972–2974, Jun. 1997.
Roberds, B.E. et al, Wafer Bonding of GaAs, InP, and Si Annealed Without Hydrogen For Advanced Device Technologies, Elect. Soc. Proc., vol. 97–36, pp 592–597, 1997.
Venkatasubramanian, R. et al, 1992, High–quality Eutectic–metal–bonded AlGaAs–GaAs Thin Films On Si Substrates, Appl. Phys. Lett., vol. 60, No. 7, pp 886–888, Feb. 1992.
Tachikawa, M. et al, 1990, Dislocation Generation of GaAs On Si nIn The Cooling Stage, Appl. Phys. Lett. 56 (22), pp 2225–2227, May, 1990.
Fritzgeral, E.A. et al, 1988, Elimination of Interface Defects in Mismatched Epilayers By A Reduction In Growth Area, Appl. Phys. Lett. 52 (18), May, 1989.
Spierings G A C M et al.: "Diversity and interfacial phenomena in direct bonding" Electrochem. Soc., Pennington, NJ, USA, Oct. 1991.
International Search Form Dated Apr. 14, 2000 PCT/US99/27785.

* cited by examiner

Primary Examiner—Kevin M. Picardat
(74) Attorney, Agent, or Firm—Foley, Hoag & Eliot; W. Hugo Liepmann; Kevin A. Oliver

(57) ABSTRACT

The method of the present invention is used to join two dissimilar materials together, and particularly to transfer a film to a substrate when the difference in thermal expansion coefficients between the film and the substrate is very big. A hydrophilic surface is created on one material and an atmosphere reactive metal element is deposited on the surface of another material. When the materials are tightly contacted, with the reactive element pressed against the hydrophilic surface, the reactive metal element reacts with the moisture from the hydrophilic surface at room temperature. Strong bonds form during the reaction joining the two materials together. Because the procedure takes place at room temperature, extremely low stress is built in. The film joining is successful even with a big thermal expansion coefficient difference between the materials, such as exist between GaAs and silicon and between silicon and sapphire. The joined materials can sustain typical post-joining device process such as OMCVD growth, wet and dry etching, thin film deposition, and thermal annealing.

26 Claims, 6 Drawing Sheets

METHOD FOR JOINING WAFERS AT A LOW TEMPERATURE AND LOW STRESS

FIELD OF THE INVENTION

The invention pertains to the field of joining dissimilar materials together. More particularly, the invention pertains to joining two semiconductor wafers together at a low temperature and low stress when the wafers have different thermal expansion coefficients and lattice constants.

BACKGROUND OF THE INVENTION

Wafer-joining technology is a technology which can integrate various properties from different materials into one compact process-compatible material system. The technology has great potential to innovate the current high technology industries. For example, joining GaAs or InP to silicon can result in the integration of optical and electronic devices and enhance the performance of computers and other electronic systems, because GaAs and InP have direct bandgaps suitable for semiconductor lasers whereas silicon, the most widely used material for electronic devices, has an indirect bandgap unfavorable to optoelectronic devices. In another application, because GaAs has the state-of-art quantum efficiency for solar cells but is more than twice as heavy as silicon, the joining of GaAs films with silicon substrates reduces the solar cell weight to half what it would be with other materials. The availability of high efficiency, light weight GaAs-on-Si solar cells makes more cost effective satellites which are completely powered by solar cells.

In heteroepitaxy, GaAs film is directly grown on silicon by Molecular Beam Epitaxy (MBE) or Metal Organic Chemical Vapor Deposition (MOCVD). The epitaxial growth takes place above 600° C. in a furnace. The thermal expansion coefficient of GaAs is $6.8 \times 10^6/°$ C. which is more than twice that of silicon ($2.6 \times 10^6/°$ C.). Researchers in the NTT Opto-electronics Laboratories found that when the furnace cools down, high density dislocations of $10^7/cm^2$ are generated. Such high density dislocations in a GaAs crystal degrades any minority carrier devices made with it. (Appl. Phys. Let. 56, May 28, 1990 pp 2225).

MIT Lincoln lab (Liau et al.) have disclosed a wafer fusion technique in Appl. Phys. Let. 56, 1990, pp 737, successfully infusing GaAs and InP together at a high temperature. In their process, a GaAs wafer and an InP wafer were pressed together with extreme pressure at 750° C. in the presence of phosphine (PH3). Phosphine provides a saturated phosphorous atmosphere to prevent decomposition of the phosphorous from the InP wafer. Covalent bonds are formed between GaAs wafer and InP wafer. These bonds make the wafers stick strongly to each other.

Bellcore (Lo et al.) disclose in U.S. Pat. No. 5,207,864 a direct wafer bonding technique performed at a relatively low temperature and low pressure. GaAs and InP wafers are dipped in diluted HF acid to remove the native oxide on the surfaces. Then, GaAs and InP wafers are put together with a pressure of 200 g/cm² in a furnace at 650° C. Hydrogen flows during the process to keep surfaces from oxidizing again. Atoms at the interface between the GaAs and InP wafers migrate to lower the interface free energy and strong covalent bonds form at that temperature.

These techniques are not suitable to transfer a GaAs film to a silicon substrate because GaAs and silicon have a big difference in thermal expansion coefficients. Although the bulk GaAs wafer and silicon wafer can be fused together at temperatures above 550° C., huge stress builds up when the wafers are cooled to room temperature due to the big difference in thermal expansion coefficients. When the GaAs wafer is thinned down to a film level for device fabrication, the built-in stress is totally exerted on that film. The thin film cannot stand such huge stress, whereupon it cracks as reported in the wafer joining of silicon and sapphire disclosed in Appl. Phys. Let. 70, Jun. 2, 1997 pp 2972. Researchers Roberds et al. from Sandia National Laboratories disclose a technique in the proceedings of the Fourth International Symposium on "Semiconductor Wafer Bonding: Science, Technology, And Applications" (*Electrochemical Society Proceedings,* Volume 97–36 pp 592). The researchers lowered the bonding temperature to 300° C.~450° C. while using plasma to activate the surface of the GaAs and silicon wafers so that they could be bonded together. However, the built in stress was still great enough to break the GaAs film into fragments when the GaAs wafer was lapped down to 50 μm.

At room temperature, cleaned GaAs and silicon wafers can stick to each other by Van Der Waals bonds, but the bonding strength is too weak to allow further processing of the joined wafers. When the bonded GaAs and silicon wafers are heated up to 170 C., they debond. In addition, this bonding cannot withstand wet-etching, since the solution gets into the interface to make the wafers debond at room temperature.

A successful approach transferring GaAs film to silicon substrate, called eutectic-metal-bonding(EMB), is disclosed by Venkatasubramanian et al. from Research Triangle Institute in Appl. Phys. Let. 60(7), Feb. 17, 1992 pp 886. GaAs film is successfully hetero-grown on a Ge substrate by MOCVD at temperatures above 700° C. because GaAs and Ge are lattice matched and also have very similar thermal expansion coefficients. After the growth, a film of gold is evaporated onto the surface of the epitaxial GaAs layer and a clean silicon wafer. Then, the two Au-coated wafers are stacked face to face in intimate physical contact in an alloying furnace, where they are annealed at ~430° C. According to the reference, the bonding of the GaAs layer on Ge substrate to the silicon wafer occurs by the formation of low-temperature eutectics of Au—Si and Au—GaAs. Following the alloying, the Ge substrate is selectively removed by a $CF_4/O_2$ plasma-etching process, leaving the GaAs film on the silicon substrate.

This method of bonding requires an alloying furnace and a step of alloying at ~430° C. The eutectics formed during the alloying also result in stress built into the GaAs film. The use of the gold element introduces deep levels in the silicon which is not suitable for further making MOS devices on the silicon. In this disclosure, the growth of the GaAs film was a hetero-growth on a Ge substrate instead of a homo-growth on GaAs, the motivation for which is probably that the interface after EMB cannot stand wet-etching to remove the GaAs substrate. Instead, Ge has to be employed because Ge can be etched by $CF_4/O_2$ plasma.

SUMMARY OF THE INVENTION

The method of the present invention is used to join two dissimilar materials together, and particularly to transfer a film to a substrate when the difference in thermal expansion coefficients between the film and the substrate is very big. A hydrophilic surface is created on one material and an atmosphere reactive metal element is deposited on the surface of another material. When the materials are tightly contacted, with the reactive element pressed against the hydrophilic surface, the reactive metal element reacts with the moisture from the hydrophilic surface at room temperature. Strong bonds form during the reaction joining the two materials together. Because the procedure takes place at room temperature, extremely low stress is built in. The film joining is successful even with a big thermal expansion coefficient difference between the materials, such as exist between GaAs and silicon and between silicon and sapphire. The joined materials can sustain typical post-joining device process such as OMCVD growth, wet and dry etching, thin film deposition, and thermal annealing.

DESCRIPTION OF THE PREFERRED EMBODIMENT

Figure 1:
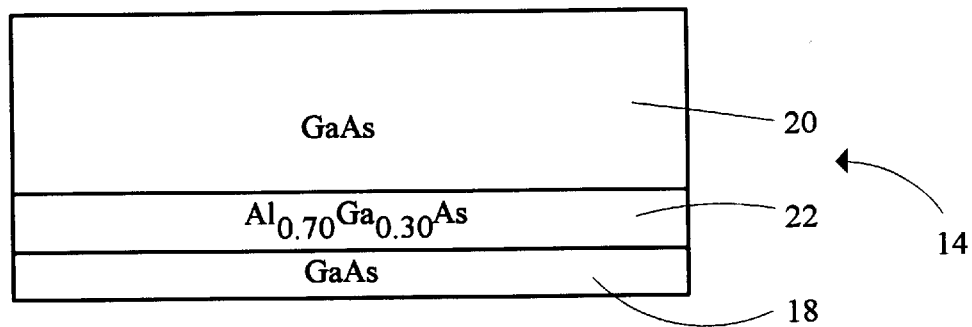
FIG. 1 shows a first wafer to be joined to a second wafer according to the method of the present invention in a first experiment.
Figure 2:
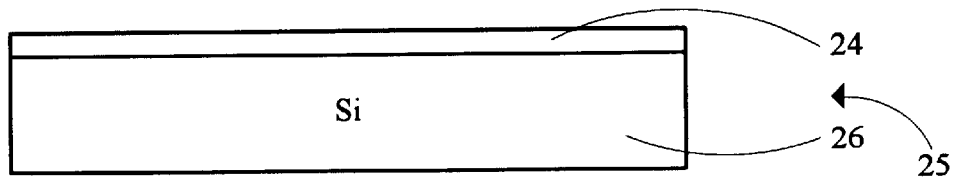
FIG. 2 shows the second wafer to be joined to the first wafer according to the method of the present invention in the first experiment.

Referring to FIGS. 1–5, a first example of the method of the present invention is shown in which GaAs is joined to silicon and an $Al_{0.70}Ga_{0.30}As$ layer is used as a reactive film. A 700 nm $Al_{0.70}Ga_{0.30}As$ layer 22 is first deposited on a GaAs substrate 20 by a deposition technique such as MOCVD, followed by another 500 nm GaAs layer 18. A silicon wafer 26 (FIG. 2) is used for wafer-joining as a new host wafer. The GaAs and silicon wafers 14, 26 were ultrasonically cleaned in acetone, isopropanal and deionized water subsequently. Silicon wafer 26 was then cleaned in a $NH_4OH:H_2O_2:H_2O$ (1:1:5 by volume) solution for 10 minutes at 75° C. After being rinsed in deionized water, wafer 26 was put into another solution with a composition rate of $HCl:H_2O_2:H_2O=1:1:5$ at 75° C. for ten minutes, then rinsed in water again and blown dry for wafer-joining.

Figure 3:
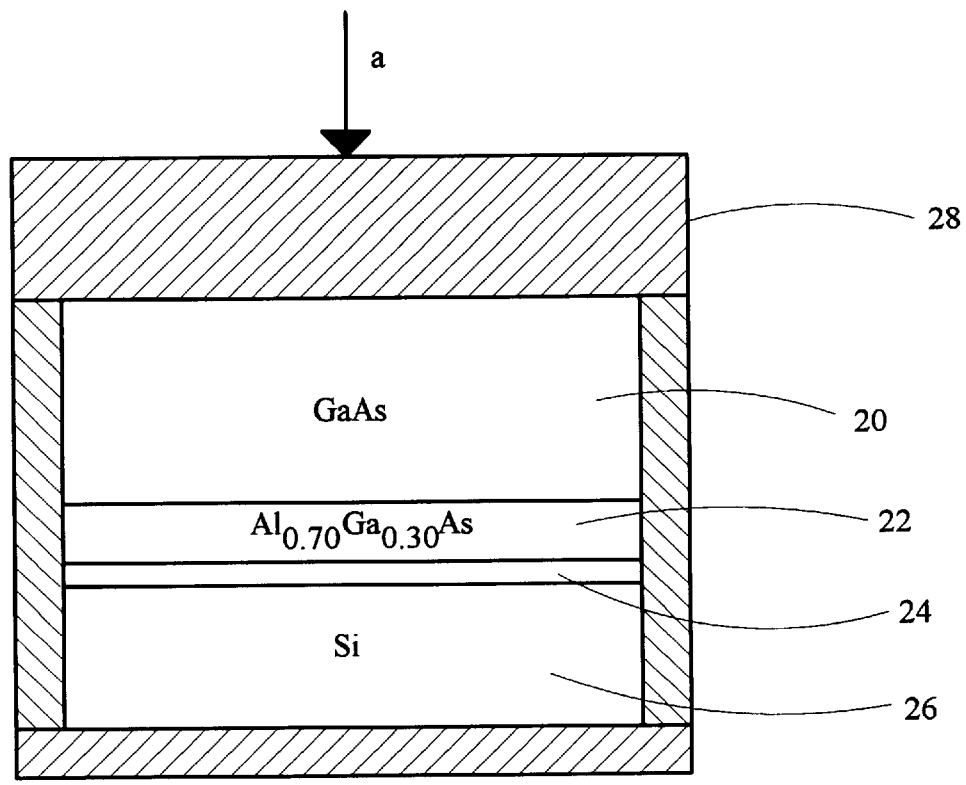
FIG. 3 shows joining the first wafer to the second wafer according to the method of the present invention in the first experiment.

In this situation, the silicon wafer surface was hydrophilic after those procedures of cleaning and there was a thin layer 24 of moisture on the surface of wafer 26. The 500 nm GaAs layer 18 was selectively removed in a solution mixed with $H_2O_2$ and $NH_4OH$ with a pH value of 8.4, thus exposing the reactive film layer 22 of 700 nm $Al_{0.70}Ga_{0.30}As$. Then the two wafers were attached face to face as shown in FIG. 3. The two wafers adhered to each other at room temperature (around 20° C.). A vise 28, used to tightly clamp the two wafers via a force shown by an arrow a, was not released until after 65 hours. The exact amount of time depends on the temperature, humidity, and the chemical properties of the reacting materials. The minimum time is believed to be around 30 minutes, although several hours (at least two) would be preferable.

Figure 4:
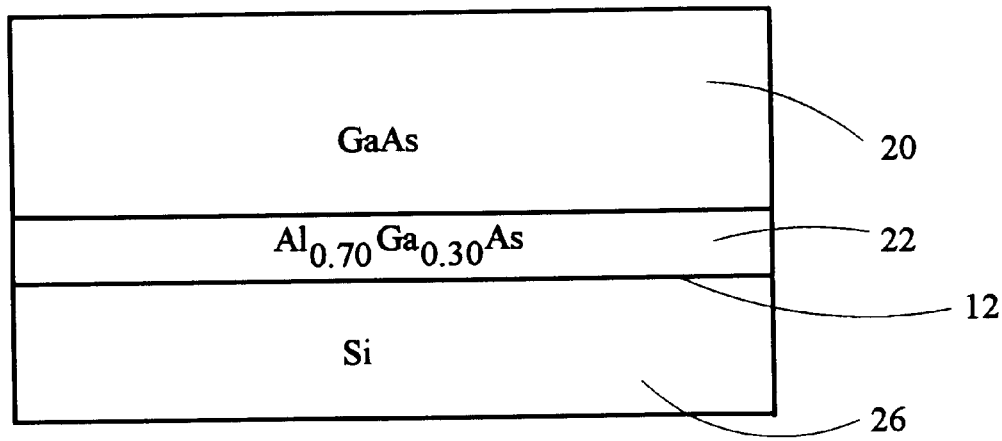
FIG. 4 shows a wafer after joining the first and second wafers together according to the method of the present invention in the first experiment.
Figure 5:
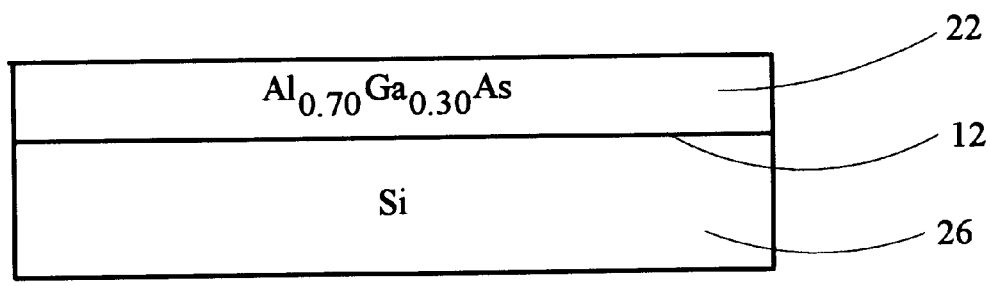
FIG. 5 shows a wafer after removing a layer from the wafer of FIG. 4 in the first experiment.

During this period, a surface chemical (most likely oxidization related) process took place and the reactive film bonded to Si at the interface 12 as shown in FIG. 4. After releasing vise 28, silicon layer 26 was tightly bonded to layer 22. Thus, the GaAs substrate 20 was successfully joined to silicon wafer 25. In this situation, the GaAs layer 20 can be lapped down to a film of any thickness suitable for device fabrication. In our process, the silicon wafer 25 is free from deep levels produced by gold as described in the background art. In our experiment, the GaAs substrate 20 was selectively etched by jet-etching with an 8.4 pH solution comprising $H_2O_2$ and $NH_4OH$ which does not attack the $Al_{0.70}Ga_{0.30}As$ layer 22. Thus, in addition to GaAs, a smooth and crack-free $Al_{0.70}Ga_{0.30}As$ layer 22 can also be transferred to silicon layer 26 as shown in FIG. 5.

EXPERIMENT 2

Figure 6:
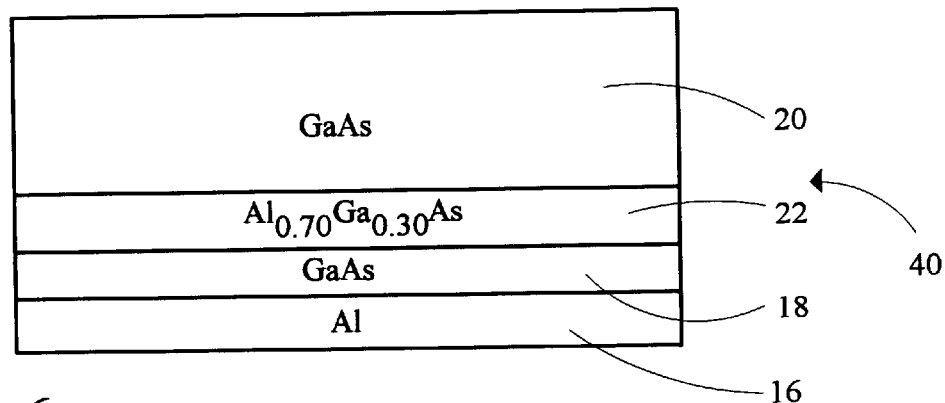
FIG. 6 shows a first wafer to be joined to a second wafer according to the method of the present invention in a second experiment.
Figure 7:
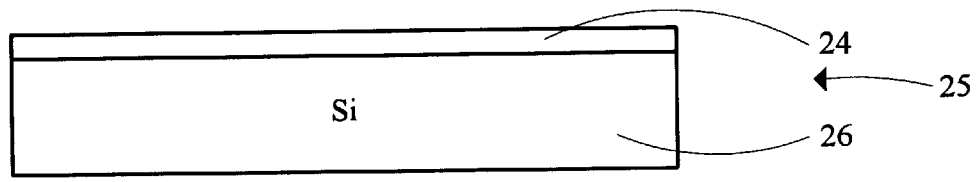
FIG. 7 shows the second wafer to be joined to the first wafer according to the method of the present invention in the second experiment.

Referring to FIGS. 6–7, a second example of the method of the present invention is shown in which GaAs is joined to silicon and an aluminum film is used as a reactive film. A 700 nm $Al_{0.70}Ga_{0.30}As$ layer 22 was first deposited on a GaAs substrate 20 by MOCVD, followed by another 500 nm GaAs layer 18 as described in the first example (FIG. 1). Both GaAs and silicon wafers 40, 25 were ultrasonically cleaned in acetone, isopropanal and deionized water subsequently. Silicon wafer 25 was then cleaned in a $NH_4OH:H_2O_2:H_2O$ (1:1:5 by volume) solution for 10 minutes at 75° C. After being rinsed in deionized water, wafer 25 was put into another solution with a composition rate of $HCl:H_2O_2:H_2O=1:1:5$ at 75° C. for ten minutes, after which it was rinsed in deionized water. In this situation, the silicon wafer surface was hydrophilic after those cleaning procedures with a thin layer 24 of moisture on the surface of silicon layer 26. A film 16 of 5 nm aluminum was evaporated on the surface of GaAs wafer 40 for use as a reactive layer.

Figure 8:
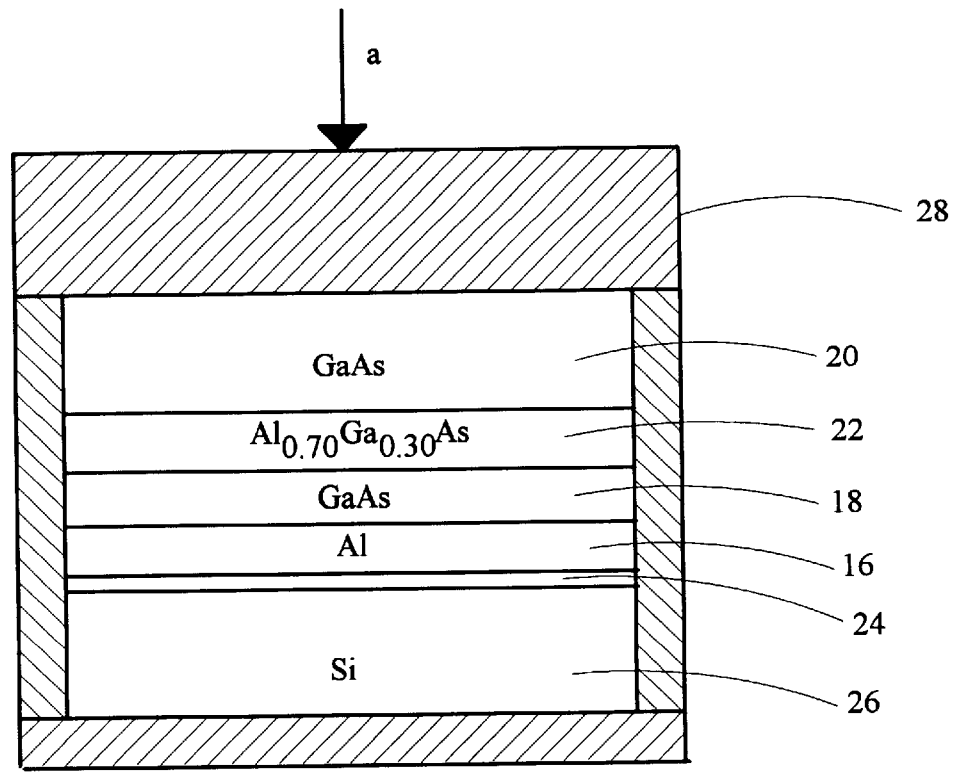
FIG. 8 shows joining the first wafer to the second wafer according to the method of the present invention in the second experiment.
Figure 9:
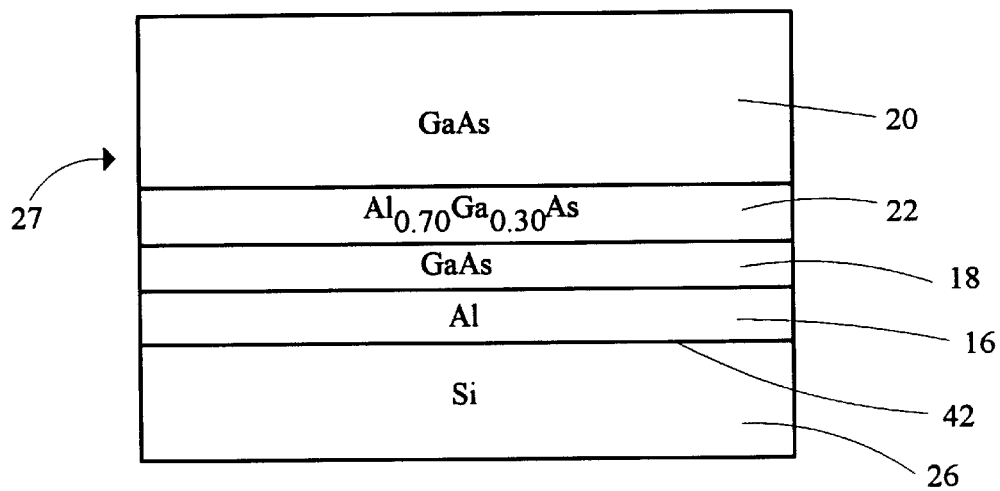
FIG. 9 shows a wafer after joining the first and second wafers together according to the method of the present invention in the second experiment.

Referring to FIG. 8, the two wafers 25 and 40 were attached face to face. The combined wafers 25, 40 were carefully loaded in a vise 28, which was tightened to ensure intimate contact. Vise 28 was released after 90 hours passed. During this period, a surface chemical (likely oxidation related) process took place and the reactive film bonded to Si at the interface 42 as shown in FIG. 9. A wafer 27 was the result.

Figure 10:
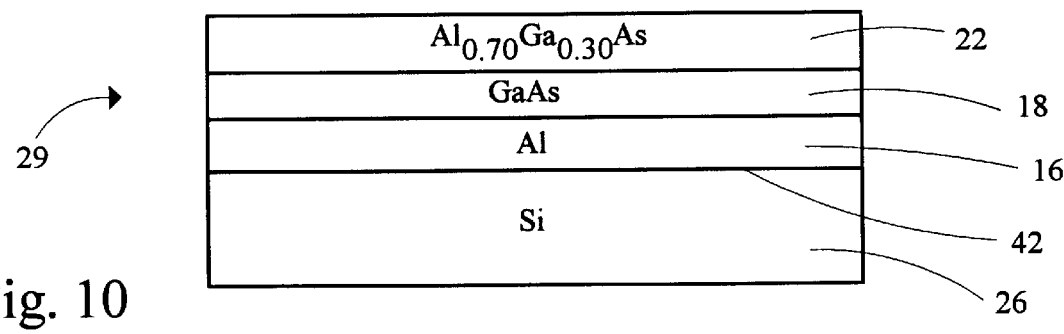
FIG. 10 shows a wafer after removing a layer from the wafer of FIG. 9 in the second experiment.

Referring to FIG. 10, the GaAs substrate 20 was selectively etched by jet-etching with a pH=8.4 combination solution of $H_2O_2$ and $NH_4OH$ leaving a wafer 29. Because the solution does not attack $Al_{0.70}Ga_{0.30}As$ layer 22, $Al_{0.70}Ga_{0.30}As$ layer 22 acted as an etch-stopping layer. A typical GaAs substrate 20 is about 15 to 25 mils (about 370 to 600 micrometers) thick, and the thermal stress due to temperature variation and thermal expansion coefficient difference increases with the GaAs substrate thickness. Therefore, without first thinning the GaAs substrate 20 to less than approximately one tenth of its original thickness, wafer 27 bonded at around 20 to 60° C. may not be able to sustain the post-wafer processing at temperatures higher than around 150° C. Once the major portion or the entire GaAs substrate 20 is removed to form wafer 29, wafer 29 is more stable and can sustain higher temperature processes such as epitaxial growth and annealing.

Figure 11:
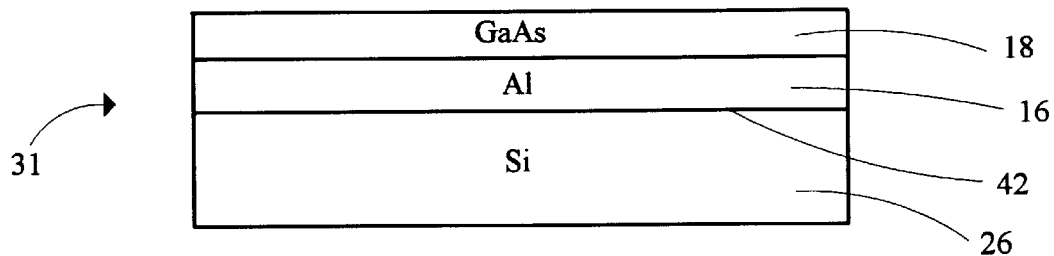
FIG. 11 shows a wafer after removing a layer from the wafer of FIG. 10 in the second experiment.

To further enhance the bonding strength of wafer 29, we annealed the sample at approximately 350° C. for 1 hour. During the thermal treatment, the temperature rose and fell slowly at a rate of about 10° C./min. We prefer lower temperature thermal treatments (e.g. 300° C.) for longer time (e.g. 4 hours) than higher temperature treatments (e.g. 700° C.) for shorter time (e.g. 20 minutes) to enhance the bonding strength without subjecting wafer 29 to excessive thermal stress. After the treatment, layer 22 was removed in pure HCl acid, leaving a wafer 31 consisting of 500 nm GaAs film layer 18 joined to silicon layer 26 via reactive film 16 as shown in FIG. 11. After a surface etching (e.g. by a H2SO4:H2O2:H2O solution) to condition the GaAs surface for epitaxial growth, a plurality of GaAs and AlGaAs epitaxial layers can be grown on wafer 31 to form functional layers for various devices. After the epitaxial growth, where the temperature can reach about 700 C., wafer 31 was inspected for cracks such as described in the prior art. No cracks were observed. We believe that the GaAs film 18 is so thin that the thermal stress built-in is not big enough to crack the film even though the temperature changed to 700° C. Thus, this wafer-joining technology produces a thermal stable film on a substrate whose thermal expansion coefficient is much bigger than the film itself

OTHER EMBODIMENTS

We also used a pure bulk GaAs wafer (not shown) in place of the GaAs wafer with epitaxial layers. Using the above described method, this pure bulk GaAs wafer was joined to silicon using evaporated aluminum film as the reactive film. On the GaAs side of the wafer after joining, the bulk GaAs was lapped and polished to a 30 μm layer. After close examination, the layer was found to be perfect with no cracks.

In another experiment using the above described method, a combination reactive film was used. A titanium film was evaporated on a cleaned p-type GaAs surface. Subsequently, a 5 nm aluminum film was evaporated on a 5 nm titanium film. Then the GaAs wafer was joined to a silicon wafer to make an electrically conducting interface. Titanium is a good ohmic contact metal for p-type GaAs while aluminum is a good ohmic contact metal for silicon. In this application, aluminum and titanium were used as both a reactive metal and an ohmic contact metal.

Figure 12:
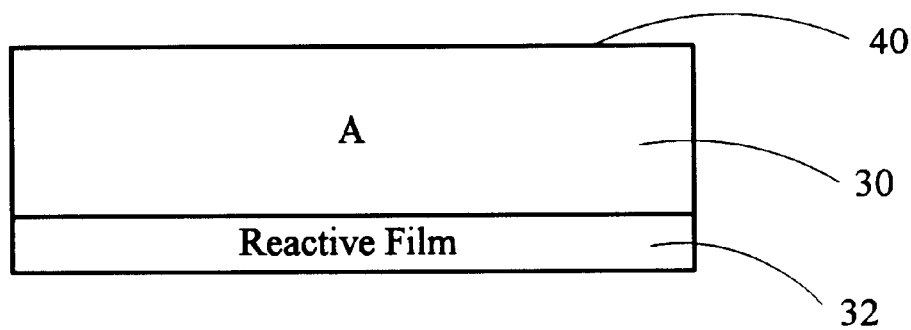
FIG. 12 shows a first wafer to be joined to a second wafer according to the method of the present invention in a generalized embodiment.
Figure 13:
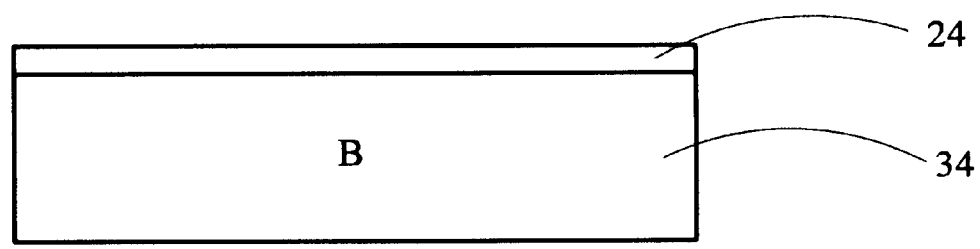
FIG. 13 shows the second wafer to be joined to the first wafer according to the method of the present invention in the generalized embodiment.
Figure 14:
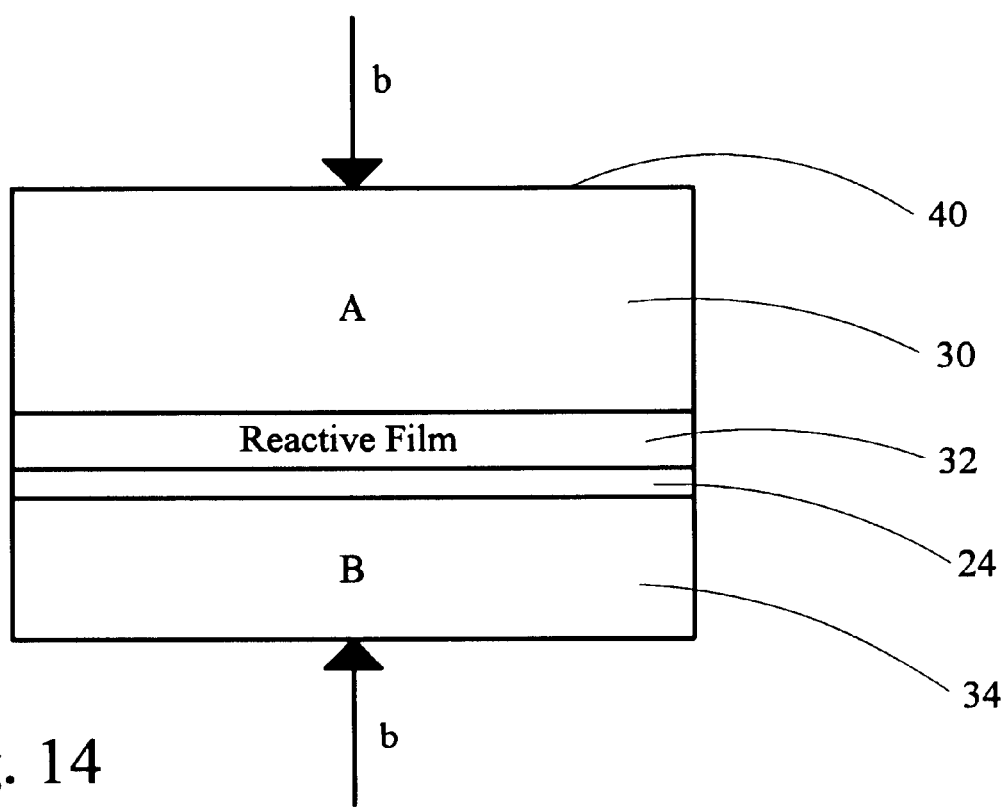
FIG. 14 shows joining the first wafer to the second wafer according to the method of the present invention in the generalized embodiment.
Figure 15:
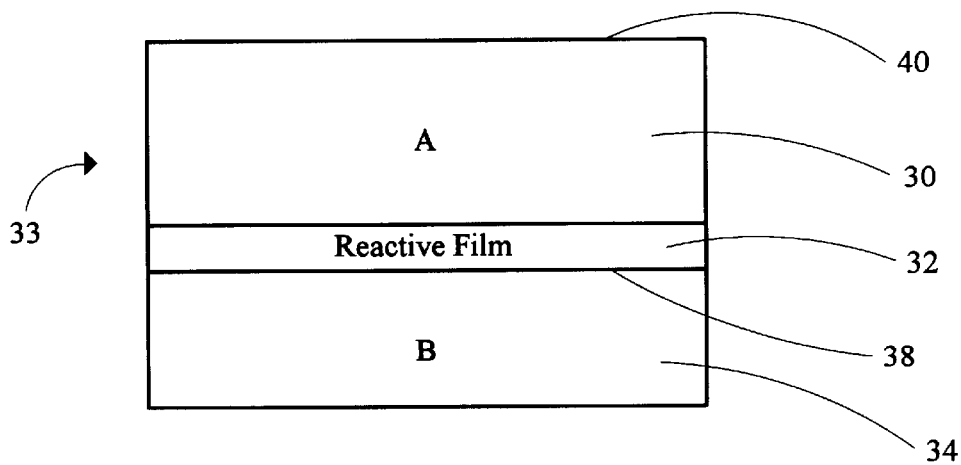
FIG. 15 shows a wafer after joining the first and second wafers together according to the method of the present invention in the generalized embodiment.

Referring to FIGS. 12–14, we believe that wafer-joining happens when the reactive element of the reactive film on the surface of one material reacts with the moisture of the hydrophilic surface of another material, thereby creating strong reactive film-oxygen bonds. Each of sample A (layer 30) and sample B (layer 34) includes one material or several materials. The surface of sample A (layer 30) includes a reactive layer 32 which contains one or several atmospheric reactive metal elements, such as, e.g., Ti, Al, Zn, Ge, Ni, W, Cr, Cu, In, Sn, Fe, Mg, Mn, Pd, Au, and Ag. This reactive layer can also be a combination layer with one layer containing atmosphere reactive elements, and a second layer used for another purpose such as electrical conduction, stress balance/compensation, and light guiding and/or reflection. The reactive element in the combination layer can be as thin as several monolayers to enhance thermal stability after the wafer-joining. Furthermore, as the reactive metal layer is as thin as a few (<10) nanometers or is evaporated on a heated (say 100° C.) surface, the metal film tends to form discrete nanometer-sized islands instead of a continuous and uniform layer. For this application and claims, the term "nanometer-sized islands" refers to islands that range from 1 nm to 30 nm high and from 3 nm to 100 nm wide. This situation is sometimes desirable when more than one metal element are deposited to form the reactive film 32. Islands of one metal element may be responsible for bonding, in reaction with layer 24; and islands of another element may be responsible for electrical conduction, capable of diffusing through layer 24 to form ohmic contact with wafer 34. The bonding material may be Al or Ti, both of which are highly reactive at room temperature to form stable oxides. The conducting material may be Pd, W, Ti, Cr, Ge, Zn, etc. that can form ohmic contacts with layer 30 and/or layer 34 by diffusing through layer 24.

Sample A is the attached to sample B by placing the hydrophilic layer 24 adjacent to the reactive layer 32. No heat is required at this step. The metals in layer 32 react with the very thin hydrophilic layer 24 adsorbed on the surface of sample B. The reaction, likely an oxidization related process, removes the moisture of hydrophilic layer 24, thus forming a strong A-oxygen-reactive film. Clamping forces b as shown in FIG. 14 ensure proper contact during the process. The pressure can vary from a fraction of an atmosphere to tens of atmosphere. Normally, higher pressure is preferred if the surfaces of the samples are relatively rough (rms surface roughness of a few nanometers). The clamping forces are removed leaving a wafer 33 as the result. After a suitable period of time, typically a few hours, when the surface reaction for bonding is completed, wafer 33 may be put in vacuum for several minutes to an hour. The purpose of this step is to remove any residue gases trapped at the interface or gases as byproducts of the bonding reaction. The last vacuum step is optional, but in some cases, it improves the thermal stability of wafer 33. This entire bonding reaction happens at room temperature given enough time. Since no heating is required during this bonding, the built-in stress field is extremely low. Thereafter, one side of wafer 33, such as, for example, layer 30 of sample A, can be etched or lapped down to a film of desired thickness for device fabrication without cracking.

Figure 16:
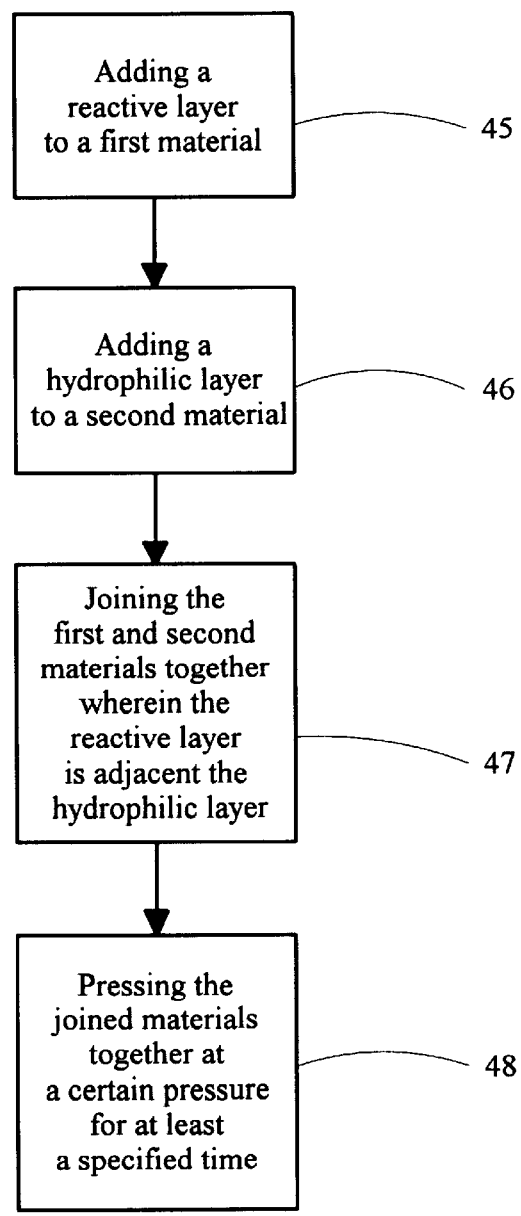
FIG. 16 shows the steps of the method of the present invention.

Referring to FIG. 16, the method of the present invention is presented in steps 45, 46, 47, and 48. First, add a reactive layer to a first material. Second, add a hydrophilic layer to a second material. Third, join the first and second materials by placing the reactive layer in contact with the hydrophilic layer. Finally, press the joined materials tightly for a minimum period of time, during which the bonding process occurs.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of directly bonding two dissimilar semiconductor materials together, comprising:
   a) adding an electrically conductive reactive layer to a first of the two semiconductor materials;
   b) adding a hydrophilic layer to the second semiconductor material;
   c) joining said first and second semiconductor materials together by placing said reactive layer in contact with said hydrophilic layer; and
   d) pressing said joined semiconductor materials tightly for a period of time sufficient for strong bonds to form between said semiconductor materials.

2. A method according to claim 1, further comprising:
   e) placing, after said step of pressing, said joined materials in vacuum to remove any residue gasses.

3. A method according to claim 1, wherein step (a) is accomplished by evaporation and deposition.

4. A method according to claim 3, wherein step (a) is accomplished by MOCVD.

5. A method according to claim 1, wherein step (b) is accomplished by exposing said second semiconductor material to $H_2O_2$.

6. A method according to claim 1, wherein step (b) is accomplished by exposing said second semiconductor material to a first fluid consisting essentially of $NH_4OH$, $H_2O_2$, and $H_2O$ followed by exposing said second semiconductor material to a second fluid consisting essentially of $HCl$, $H_2O_2$, and $H_2O$.

7. A method according to claim 1, wherein said reactive layer includes reactive elements.

8. A method according to claim 1, wherein said reactive layer includes discrete nanometer-sized islands.

9. A method according to claim 1, wherein said reactive layer includes reactive metal elements.

10. A method according to claim 9, wherein said reactive metal elements are selected from the group consisting of Al, Ti, Zn, Ge, Mg, Fe, Ni, W, Cr, and Pd.

11. A method according to claim 1, wherein said period of time is at least two hours.

12. A method according to claim 1, wherein said steps of joining and pressing are at room temperature.

13. A method according to claim 12, wherein said period of time is between 30 minutes and 65 hours.

14. A method according to claim 1, wherein said step of pressing is at a pressure between about 0.1 to 10 atmospheres.

15. A method according to claim 1, wherein said first semiconductor material is one of GaAs and AlGaAs.

16. A method according to claim 1, wherein said second semiconductor material is Si.

17. A method according to claim 1, wherein said first semiconductor material is one of GaAs and AlGaAs and said second semiconductor material is Si.

18. A method according to claim 1, wherein said reactive layer is one of Al and $Al_xGa_{1-x}As$.

19. A Method according to claim 18, wherein x is greater than 0.5.

20. A method of directly bonding two dissimilar semiconductor materials together, comprising:
   a) disposing a first metallic layer on a first of the two semiconductor materials, the first metallic layer forming an ohmic contact with at least one of the two semiconductor materials;
   b) disposing a second metallic layer on the first metallic layer, the second metallic layer forming a reactive layer;
   c) adding a hydrophilic layer to the second semiconductor material;
   d) joining said first and second semiconductor materials together by placing said reactive layer in contact with said hydrophilic layer; and
   e) pressing said joined semiconductor materials tightly for a period of time sufficient for strong bonds to form between said semiconductor materials.

21. A method according to claim 20, wherein said first metallic layer comprises at least one element selected from the group consisting of Al, Pd, W, Ti, Cr, Ge, and Zn.

22. A method according to claim 20 wherein said second metallic layer comprises at least one element selected from the group consisting of Al, W, Ti, Cr, Cu, In, Sn, Ge, Fe, Mg, Mn, Pd, Au, Ag, Zn, and Ni.

23. A method according to claim 20, wherein said second metallic layer includes discrete nanometer-sized islands.

24. A method according to claim 22, wherein said second matallic layer includes at least two of the elements, with at least one of the elements forming discrete nanometer-sized islands.

25. A wafer made by the process of claim 1.

26. A wafer made by the process of claim 20.

* * * * *